United States Patent [19]

Anders et al.

[11] Patent Number: 4,859,896
[45] Date of Patent: Aug. 22, 1989

[54] PIEZOELECTRIC PRECISION POSITIONING DEVICE

[75] Inventors: Michael Anders, Giessen; Christoph Heiden, Linden, both of Fed. Rep. of Germany

[73] Assignee: Ernst Leitz Wetzlar GmbH, Wetzlar, Fed. Rep. of Germany

[21] Appl. No.: 183,187
[22] PCT Filed: Jul. 2, 1987
[86] PCT No.: PCT/DE87/00296
  § 371 Date: Mar. 4, 1988
  § 102(e) Date: Mar. 4, 1988
[87] PCT Pub. No.: WO88/00399
  PCT Pub. Date: Jan. 14, 1988

[30] Foreign Application Priority Data

Jul. 4, 1986 [DE] Fed. Rep. of Germany ....... 3622557

[51] Int. Cl.[4] .............................................. H01L 41/08
[52] U.S. Cl. .................................... 310/328; 310/366
[58] Field of Search .............. 310/317, 328, 366, 369, 310/330-332

[56] References Cited

U.S. PATENT DOCUMENTS

| 1,769,360 | 7/1930 | Thomas | 310/328 X |
| 2,515,446 | 7/1950 | Gravley | 310/366 X |
| 3,902,084 | 8/1975 | May, Jr. | 310/328 |
| 4,128,616 | 12/1978 | Coldren et al. | 310/328 |
| 4,489,609 | 12/1984 | Burdess | 310/366 X |
| 4,678,955 | 7/1987 | Toda | 310/328 |

FOREIGN PATENT DOCUMENTS 0071666 2/1983 European Pat. Off. .
0136785 8/1983 European Pat. Off. .

OTHER PUBLICATIONS

Binning et al., "Surface Studies by Scanning Tunneling Microscopy," Physical Review Letters, vol. 49, No. 1, Jul. 5, 1982, pp. 57-61.

van de Walle et al., "High-stability Scanning Tunneling Microscope," Rev. Sci. Instrum. 58(8) Aug. 1985, pp. 1573-1576.

IBM Technical Disclosure Bulletin, vol. 27, No. 10B, Mar. 1985, (New York, U.S.), "Fast Scan Piezo Drive," pp. 5976-5977.

Primary Examiner—Mark O. Budd
Attorney, Agent, or Firm—Foley & Lardner, Schwartz, Jeffery, Schwaab, Mack, Blumenthal & Evans

[57] ABSTRACT

A piezoelectric precision positioning device for moving an object in three coordinate directions is described, comprising
(a) an at least approximately plane-parallel cut piezoelectric disk (5),
(b) an electrode arrangement (6, 7, 8, 17), provided with electrical connections (9, 10, 11, 18), on the surfaces parallel to each other, with which three independently controllable electrical fields in the piezoelectric disk (5) can be adjusted,
(c) a fork-shaped clamping device (1, 2) which embraces the piezoelectric disk (5), in an electrically insulated manner with respect to the electrode arrangement (6, 7, 8, 17), at at least three pressure points (13, 14, 15, 16), which are situated symmetrically with respect to each other, on the circumferential surface such that
(d) one of the electrodes (8) is situated in the open part of the fork-shaped clamping device (1, 2), in which case
(e) the object (19) to be positioned is arranged in an electrically-insulated manner on an electrode surface (17) in the field region of this electrode (8).

12 Claims, 3 Drawing Sheets

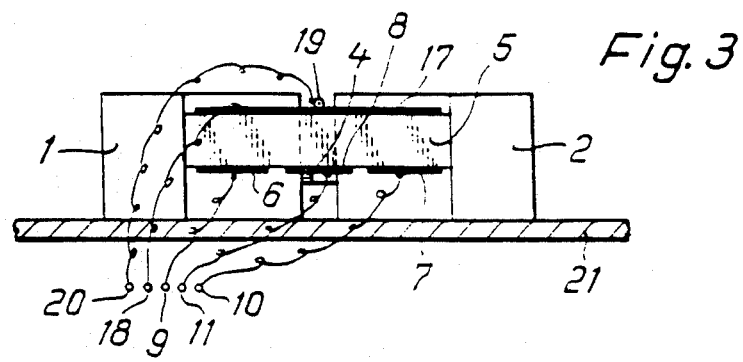
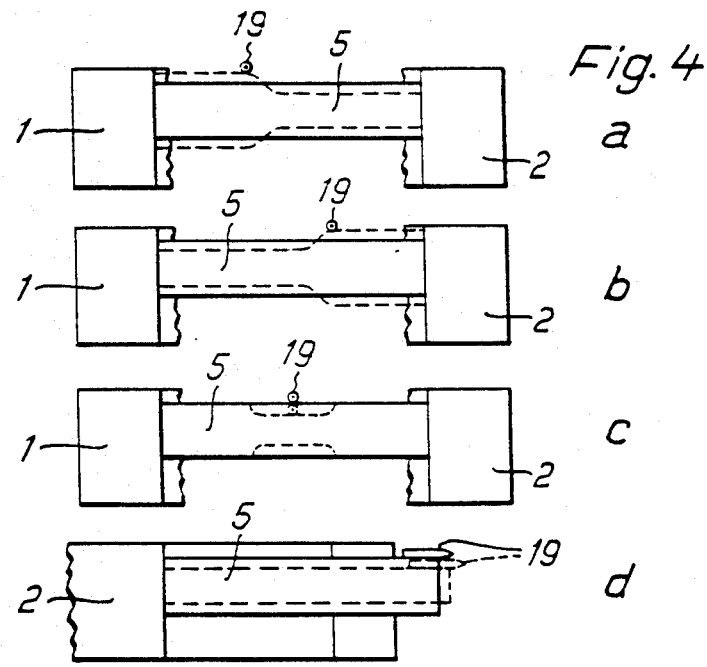
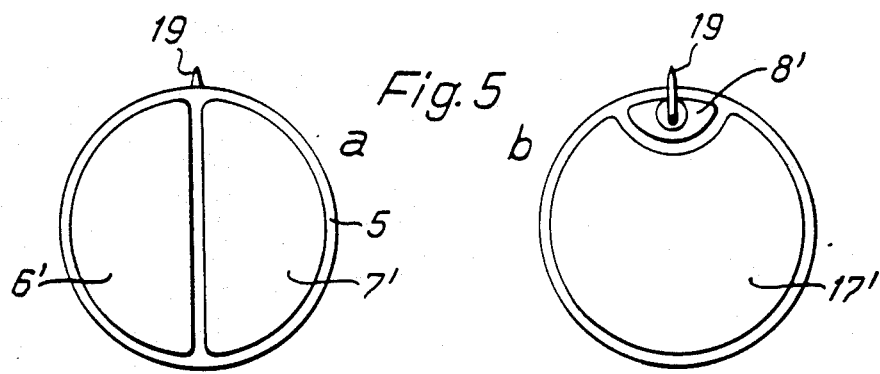

PIEZOELECTRIC PRECISION POSITIONING DEVICE

BACKGROUND OF THE INVENTION

The invention relates to a piezoelectric precision positioning device for moving an object in three coordinate directions and a method for controlling the precision positioning device.

As precision positioning in the context of the invention, a positioning accuracy of better than $10^{-10}$ m is understood, i.e. a movement in the region of atomic dimensions. Devices of this type form e.g. the basis for the examination of surface topography using the tunnel effect. In this case, the precision positioning device moves a pointed scanning needle at a specified distance in a raster pattern across the surface to be investigated, in which process e.g. the tunnel current is used to regulate the distance and the controlled variable is represented as a function of the position signal of the scanning tip (scanning tunnel microscopy).

The precision positioning device must fulfil two requirements in particular. It must be particularly stable mechanically in order to render the system insensitive to vibrations in the environment. The resonance frequency of the device should be as high as possible in order to be able to achieve as high a scanning raster velocity as possible which, in addition to higher spatial resolution, also makes a better time resolution possible in the observation of dynamic processes.

The devices of this type known hitherto use piezoelectric components as positioning elements. In the case of the piezoelectric tripod described in Phys. Rev. Lett., volume 49, No. 1 (1982), pages 57–61, e.g. three strips of a piezoelectric ceramic situated at right angles to each other are combined in the form of a pyramid. The tip of the pyramid can be moved by altering the length of the strips in the three spatial directions. A disadvantage of this arrangement is its relatively large mass which results in a low resonance frequency and, consequently, in an increased susceptibility in relation to thermal drift phenomena.

In another form of construction known from Rev. Sci. Instrum., vol. 56, No. 8 (August 1985), pages 1573–1576, very small piezoelectric ceramic cubes and metal cubes are glued onto each other in checker-board fashion. Although this positioning device has a smaller mass, a large proportion of the total mass is formed from material which is not piezoelectrically active. The interposed metal cubes also reduce the resonance frequency here.

Common to both forms of construction is the fact that they consist of at least three different pieces of a piezoelectric ceramic which are joined to each other by gluing, screwing, clamping or the like. This introduces mechanical weak points which, under cyclic thermal conditions, are severely loaded mechanically owing to the different thermal coefficients of expansion of the materials which are rigidly joined together.

The invention was therefore based on the object of providing a precision positioning device which exhibits a low vibration sensitivity, has a high resonance frequency which is substantially insensitive to temperature, and, in particular, can also be used in the low-temperature range, and which makes possible a flat constructional form and as simple a construction as possible.

SUMMARY OF THE INVENTION

An outstanding feature of the device according to the invention is the systematic minimization of parasitic, piezoelectrically inactive masses with, at the same time, an extremely low total mass of the actual drive body. The latter consists of a single, inherently homogeneous piezoelectric component. The clamping device, which is static relative to the drive body, may be manufactured from a material whose thermal coefficient of expansion is matched to that of the drive body. In addition, in controlling the drive body, only a negligible relative movement takes place between the drive body and the clamping points. Insofar as distance variations occur between the clamping points, they are absorbed by the elasticity of the fork jaws of the clamping device.

Exemplary embodiments of the device according to the invention are shown diagrammatically in the drawing. Their mode of operation is described below by reference to the figures. In detail:

BRIEF DESCRIPTION OF THE DRAWINGS

FIG. 3 shows a front view of the precision positioning device,

FIG. 4 shows a diagrammatic representation of the movements in (a,b) the tangential,
(c) the axial and
(d) the radial direction,
FIG. 5 shows another possibility for the arrangement of the electrodes.

DETAILED DESCRIPTION OF THE INVENTION

Figure 1:
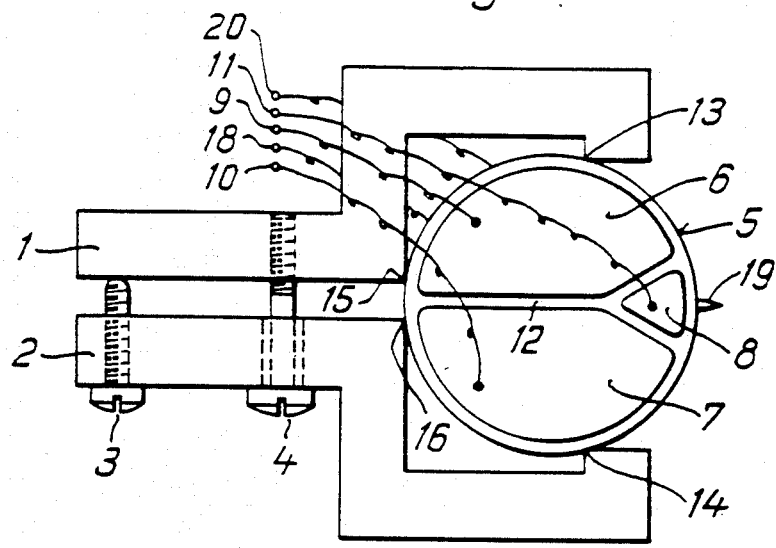
FIG. 1 shows a view from below of the precision positioning device.

The precision positioning device shown in FIG. 1 contains a fork-shaped clamping device composed of two jaws 1, 2. The two jaws 1, 2 are held together by a bearing screw 4 and can be adjusted with respect to each other as a gripping device by a clamping screw 3. In a simpler refinement, the jaws may be rigidly joined together in the region of the clamping screw, in which case bracing against the spring force of the jaws can then take place in the region of the screw 4. The clamping device may be manufactured from brass. However, a ceramic or glass-ceramic material may be selected if this is more expedient e.g. because of the thermal properties.

The actual drive body, which is composed of a round, approximately plane-parallel piezoelectric disk 5, is arranged inside the jaws 1, 2. The underside of the piezoelectric disk 5 shown in FIG. 1 is occupied by three two-dimensional electrodes 6, 7, 8 to which an electrical control voltage can be applied in each case via electrical connections 9, 10, 11. The line of separation 12 between the electrode pads has the shape of a Y. The areas of the electrodes 6, 7 are at least approximately equally large, while that of the electrode 8 is very small in comparison therewith. Its maximum length and width should not be larger than the thickness of the disk 5.

The piezoelectric disk 5 is held in the pressure points 13, 14 of the outer parts of the jaws 1, 2 and, in the inner region of the jaws, is in contact with two points 15, 16 which are close together and which may also be considered as a single pressure point. The jaw length is so chosen in relation to the pressure points 13, 14 that, although the center point of the disk 5 lies within the fork area of the clamping device terminated by the connecting line between the pressure points 13, 14, it lies in the vicinity of said connecting line. This measure achieves the result that, on the one hand, the disk 5 cannot be pushed forwards out of the clamping device, and on the other hand, as large a region of the disk area as possible lies outside the disk area enclosed by the pressure points 13, 14, 15, 16. It has proved expedient for the pressure points 13, 14 to be so chosen that at least ⅓ of the disk circumference bridges the free part of the fork jaws 1, 2.

The orientation of the electrode areas is so chosen that the line of separation between the electrodes 6, 7 lies on the line of symmetry of the clamping device and the area lying in the V of the Y lies outside of the disk area enclosed by the pressure points 13, 14, 15, 16.

Figure 2:
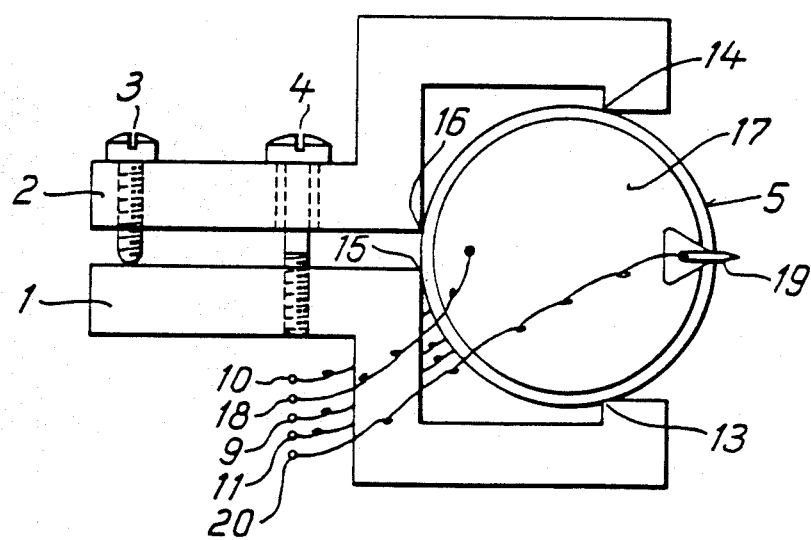
FIG. 2 shows a plan view of the precision positioning device.

From the plan view shown in FIG. 2 it can be seen that the top side of the piezoelectric disk 5 is occupied, over the entire surface, by a further electrode 17 to which a certain electrical potential can likewise be applied via an electrical connection 18. When interacting with the electrodes 6, 7, 8, this may also be e.g. the ground potential. All the electrodes are so deposited on the piezoelectric disk 5 that they are adequately insulated electrically from each other and with respect to the clamping device. Only in the case of an electrode provided as ground electrode is it possible for it to be expedient to electrically connect it directly to the clamping device if the latter is composed of electrically conducting material.

A scanning needle 19 is arranged on the electrode 17 as the object to be positioned. For use in a tunneling microscope, this may be e.g. a tungsten tip. The scanning needle 19 may, for example, be mounted with an electrically insulating glue on the electrode area 17 so that a current flow picked up by the scanning needle 19 can be conducted away via an electrical connection 20 for measurement purposes. The mounting point of the scanning needle 19 lies in the electrical field region of the electrode 8. The tip of the scanning needle 19 reaches slightly beyond the edge of the piezoelectric disk in an extension of the line of symmetry already mentioned of the clamping device.

The front view in FIG. 3 makes clear how the piezoelectric disk 5 is held in the jaws 1, 2 of the clamping device. As an amplification of FIGS. 1 and 2, the clamping device is in this case mounted on a base plate 21. This may be e.g. a small glass plate. The precision positioning device consequently itself becomes an object capable of being positioned which may be displaced e.g. by the electrically controllable drive device described in the older application No. P 3,614,996.9.

The movements, described as tangential, axial and radial, of the tip of the scanning needle 19 will be explained by reference to the diagrams shown in FIG. 4 which are considerably simplified and considerably exaggerated in relation to the volume displacements in the piezoelectric disk 5. The diagrams in FIGS. 4a, b, c are derived from the front view in FIG. 3, while FIG. 4d corresponds to a side view of FIG. 2.

It is known that, as a result of an electrical voltage applied to the electrodes of a piezoelectric disk, a contraction or dilation of the thickness of the disk can be produced which, because the volume of the disk is constant, is associated, as a rule, with a change in diameter. In the older application No. P3,614,996.9, however, an electrode arrangement with a special voltage supply was specified for which volume displacements develop inside the disk which keep the diameter constant. Use is also made of this effect in the case of the present object of invention in relation to positioning in the tangential direction, i.e. a movement of the scanning needle 19 in a direction parallel to the connecting line between the pressure points 13, 14.

A movement in the tangential direction is accordingly achieved if the difference in potentials is altered with the sum of the potentials on the electrodes 6, 7 remaining constant. In the region of the field of these electrodes, the thickness of the disk is small compared with the length or the width of the disk so that the main effect of the change in voltage produces a stretching or compression of the piezoelectric regions situated beneath the electrodes in the direction of the plane of the disk. Since the effects in the region of the two electrodes are directed opposite to each other because of the special control voltages (constancy of the sum of the potentials), the center line of the piezoelectric disk, which has the same direction as the line of separation between the electrodes 6, 7, is moved sideways. The scanning needle 19 mounted on this line therefore likewise moves in this direction described as tangential.

FIG. 4a illustrates the case where the potential on the electrode 6 produces a maximum dilation and that on the electrode 7 produces a maximum contraction. Since the outer boundary of the disk 5 cannot give way because of the clamping, the necessary equalization of volume takes place in the region of the center line. The scanning needle follows the traveling volume to the left. FIG. 4b shows the conditions if the potentials are interchanged. The scanning needle is then displaced to the right. The maximum positioning distance is determined by the difference in the control potentials and the zero position by the sum of the potentials. As already explained above, the movement of the scanning needle in the axial direction which occurs simultaneously on departing from the zero position and which can be read off from the two FIGS. 4a, b can in practice be neglected.

The potential of the electrode 8 is responsible for the movement of the scanning needle 19 in the axial direction, i.e. a movement perpendicular to the plane of the disk. Since the piezoelectric disk 5 is not fixed in this region, a voltage change produces essentially a thickness change in this region. The position of the tip of the needle changes under these circumstances by half the change in thickness as is illustrated by FIG. 4c. As already explained above, the thickness of the disk is greater in this field region than the length and width of the electrode 8. The change in length in the diameter of the disk associated with the thickness change due to the volume being constant is therefore negligible in practice.

The movement of the scanning needle 19 in the radial direction, i.e. in the direction of the longitudinal axis of the needle in the exemplary embodiment, is achieved by changing the sum of the potentials of the electrodes 6, 7 keeping the difference constant. As already mentioned, under these circumstances the piezoelectric disk 5 is in total stretched or compressed in the direction of the disk surface. The change in length in the radial direction resulting from the volume being constant can only have an effect in the direction of the open end of the jaws 1, 2 because of the clamping of the disk 5. Because of the ratio between the disk diameter and disk thickness, the superimposed movement in the axial direction which can be read off from FIG. 4d is in practice negligible.

The electrode arrangement shown in FIG. 5 differs from that mentioned above in that the electrodes 6', 7' corresponding to the two electrodes 6, 7 are now formed as semi-circular areas. The electrode 8' corresponding to the small electrode 8 is integrated in the electrode 17' corresponding to the electrode 17 and in this case carries the scanning needle 19. The movement functions assigned to the individual potentials on these electrodes are the same as described above. The orientation of the piezoelectric disk in the clamping device is analogous. The simpler geometry of the electrode arrangement provides certain advantages during its production and in the mutual electrical insulation of the electrode areas.

The above explanations have made it clear that the maximum adjustment distances in the three directions mentioned which are orthogonal to each other depend not only on the absolute and relative values of the potentials applied but also on the geometry of the piezoelectric disk. Assuming that the width and length of the small electrode 8 are about as large as the thickness of the piezoelectric disk 5, the following applies for the maximum thickness change d:

maximum tangential deflection $x_{tan} = \frac{d \cdot r}{4h}$ maximum axial deflection $x_{ax} = \frac{d}{2}$ maximum radial deflection $x_{rad} = \frac{d \cdot r}{2h}$ where r is the radius of the disk and h is its thickness. By choosing a suitable geometry for the disk, the device can be adapted to the particular measurement task in relation to resonance frequency and maximum deflection.

Figure 6:
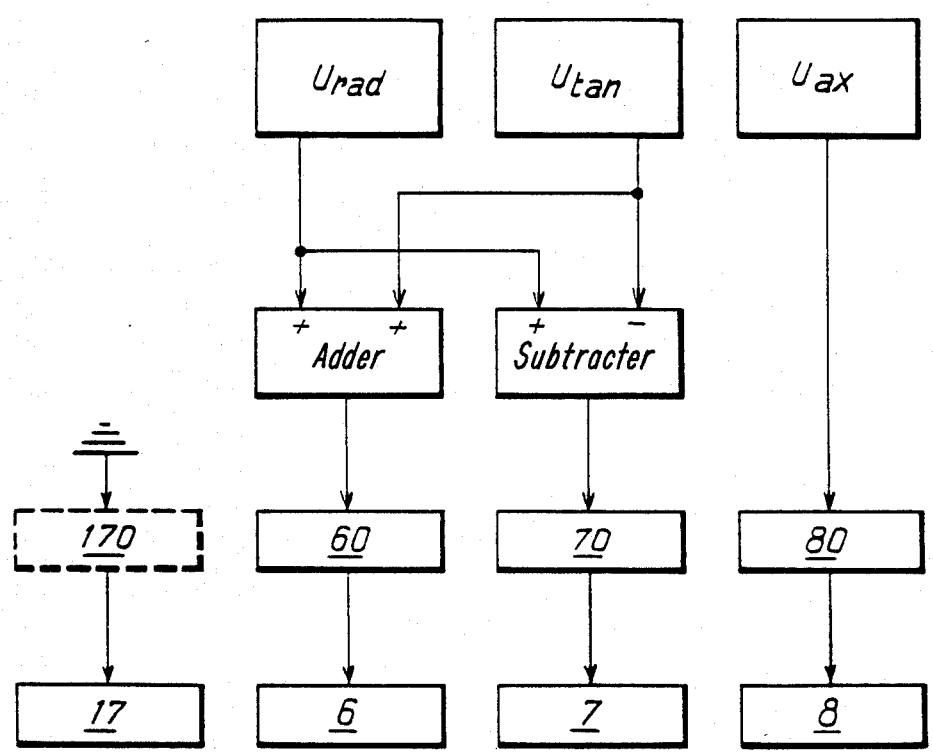
FIG. 6 shows a block circuit diagram of the control system.

FIG. 6 shows a block circuit diagram for producing the necessary potentials at the electrodes 6, 7, 8, 17 of the precision positioning device according to FIGS. 1, 2, 3. The voltages $U_{rad}$, $U_{tan}$, $U_{ax}$ are proportional to the three space coordinates of the object to be positioned and can be controlled independently. The electrode 6 has an adder connected to its input and the electrode 7 a subtracter. The basic potential $U_{rad}$ necessary for the radial movement is fed both to the adder and to the noninverting input of the subtracter as input voltage. The voltage $U_{tan}$ responsible for the tangential movement is fed to the adder and to the inverting input of the subtracter. The output voltages of the adder and the subtracter are in each case fed as a control voltage to a high-voltage amplifier 60, 70 whose outputs supplied (sic) the respective electrodes with the desired potentials. If $U_{rad}$ is constant, the sum of the potentials at the electrodes 6 and 7 consequently remains constant, even if the difference in the potentials changes as a result of alteration of $U_{tan}$. The voltage $U_{ax}$ necessary for the axial movement is likewise fed via a high-voltage amplifier 80 to the electrode 8 independently of the other voltages. The electrode 17 is connected via a high-voltage amplifier 170 to a constant potential, which may also be the ground potential, in which case it is possible to dispense with the high-voltage amplifier.

To scan an object—not shown—in a raster pattern with the scanning needle 19, $U_{tan}$ is expediently driven periodically linearly between its maximum values, $U_{ax}$ being increased linearly at the same time. The value of $U_{tan}$ then determines the length of a scanning line, while $U_{ax}$ determines the spacing of the scanning lines for a half cycle of the regulation of $U_{tan}$ $U_{ax}$ can also be increased in each case at the end of a scanning line abruptly by the value of one line spacing. $U_{rad}$ determines the distance of the needle tip from the object to be examined. This distance can be regulated via $U_{rad}$ so that a constant measuring signal is produced. However, $U_{rad}$ can also be kept constant during a measurement, in which case the varying measurement signal is recorded.

The regulation of the voltages necessary for the desired movement of the scanning needle can be controlled in a manner known per se advantageously by a microprocessor. In this case, the superimposed movements described above as negligible in practice can also be compensated for by suitable counter voltages acting in this direction.

The device according to the invention was tested with a piezoelectric disk of approximately 10 mm diameter and 2 mm thickness consisting of a material known under the description PXE 5 (manufactured by Valvo) and silver electrodes, the clamping device being manufactured from brass. As the object to be positioned use was made of a tungsten tip with which a gold layer was examined under normal conditions and with oil immersion between tip and gold layer. Under these circumstances it was possible to detect clearly individual atoms in the gold layer, which corresponds to a lateral resolution of better than $3 \times 10^{10}$ m.

We claim:

1. A piezoelectric fine positioning device for moving an object in three coordinate directions, comprising:
   a piezoelectric disk cut in a plane parallel manner;
   a layout of four flat electrodes arranged on the faces of the disk;
   electrical connections for applying a potential to each said electrode, thereby providing three independently adjustable electric fields in said disk;
   a fork-shaped clamping device for holding said disk at contact points symmetrically arranged around the circumference of said disk, one said electrode positioned so as to lie outside of the area determined by the contact points of said clamping device, said clamping device being electrically insulated from said electrodes; and
   an object mounted on said disk, said object positioned within the electrical field region of said electrode lying outside of the area determined by the contact points of said clamping device.

2. A piezoelectric fine positioning device according to claim 1, in which three electrodes are arranged on one face of said disk, these electrodes being separated and insulated from each other by a Y-shaped dividing means, and in which an undivided electrode is arranged on the other flat surface face of said disk.

3. A piezoelectric fine positioning device according to claim 2, in which the electrode lying in the V of the Y-shaped dividing means is substantially smaller than the other two electrodes on the same face of the piezoelectric disk, the other two electrodes being approximately equal in size to each other and situated predominantly in the area by the contact points of the fork-shaped clamping device.

4. A piezoelectric fine positioning device according to claim 1, in which one face of said piezoelectric disk is divided into two semi-circular electrodes of equal surface area, and the other face of said disk is divided into a larger electrode and a smaller electrode, said smaller electrode positioned on the opposite side of the dividing means between the two said equally sized electrodes, and an object positioned on said smaller electrode.

5. A piezoelectric fine positioning device according to claim I, in which said disk is round and the contact points at the outer ends of the fork jaws are so chosen that the center point of the disk is situated inside the area determined by the contact points.

6. A piezoelectric fine positioning device according to claim 5, in which at least one third of the disk circumference is positioned outside of the area defined by the contact points.

7. A piezoelectric fine positioning device according to claim 1, in which the maximum length or width of the smaller electrode is less than the thickness of the piezoelectric disk.

8. A fine positioning device according to claim 1, wherein the electrical connections of the electrodes are connected to a regulatable DC voltage source in a manner such that both the mean value of the potentials of two of the electrodes and the difference in their potentials, as well as the potential of the electrode lying outside of the area determined by the contact points of aid clamping device, are regulated independently of each other.

9. A piezoelectric fine positioning device according to claim 2, in which said object is positioned on said undivided electrode.

10. A piezoelectric fine positioning device according to claim 5, in which at least one third of the disk's circumference is positioned outside of said forkshaped clamping device.

11. A piezoelectric fine positioning device according to claim 1, in which the diameter of said disk is approximately five times as great as its thickness.

12. A piezoelectric fine positioning device according to claim 1, in which said device includes electrical connections to each electrode, whereby an unequal potential between said electrodes causes a responsive movement of the object.

* * * * *

UNITED STATES PATENT AND TRADEMARK OFFICE
CERTIFICATE OF CORRECTION

PATENT NO. : 4,859,896
DATED : August 22, 1989
INVENTOR(S) : Michael Anders et al It is certified that error appears in the above-identified patent and that said Letters Patent is hereby corrected as shown below:

Column 6, line 31, "3 x $10^{10}$m" should read --3 x $10^{-10}$m--;

line 65, "area" should read --area determined--.

Column 7, line 8, "I" should read --1--.

Column 8, line 4, "aid" should read --said--.

Signed and Sealed this

Second Day of October, 1990

Attest:

HARRY F. MANBECK, JR.

*Attesting Officer*     *Commissioner of Patents and Trademarks*